United States Patent [19]
Sandhu et al.

[11] Patent Number: 5,258,096
[45] Date of Patent: Nov. 2, 1993

[54] METHOD OF FORMING LOCAL ETCH STOP LANDING PADS FOR SIMULTANEOUS, SELF-ALIGNED DRY ETCHING OF CONTACT VIAS WITH VARIOUS DEPTHS

[75] Inventors: Gurtej S. Sandhu; Donwon Park; Tyler A. Lowrey, all of Boise, Id.

[73] Assignee: Micron Semiconductor, Inc., Boise, Id.

[21] Appl. No.: 933,433

[22] Filed: Aug. 20, 1992

[51] Int. Cl.$^5$ .................... H01L 21/306; H01L 21/265
[52] U.S. Cl. ........................................ 156/643; 437/47; 437/49; 437/52; 437/7
[58] Field of Search .................. 437/47, 48, 49, 60, 437/52, 7, 56, 200; 156/643; 148/DIG. 109

[56] References Cited
U.S. PATENT DOCUMENTS

| | | | |
|---|---|---|---|
| 5,026,657 | 6/1991 | Lee et al. | 437/47 |
| 5,030,585 | 7/1991 | Gonzalez et al. | 437/47 |
| 5,043,298 | 8/1991 | Yamada et al. | 437/48 |
| 5,134,085 | 7/1992 | Gilgen et al. | 437/48 |
| 5,145,801 | 9/1992 | Chhabra | 437/48 |
| 5,174,858 | 12/1992 | Yamamoto et al. | 437/52 |

Primary Examiner—Brian E. Hearn
Assistant Examiner—Tuan Nguyen
Attorney, Agent, or Firm—David J. Paul

[57] ABSTRACT

The present invention introduces the use of "local" etch stop layers having highly selective etch characteristics vis-a-vis insulating layers into which the contact/vias are etched. Any kind of conducting material which possesses etch selectivity to an insulator such as oxide (i.e. doped polysilicon, tungsten, tungsten silicide, titanium, titanium silicide, titanium nitride and the like) may be used and the process flow described herein uses conductively doped polysilicon as an example to accomplish this task without the need to add any extra photo or mask step to a conventional dynamic random access memory (DRAM) process flow and with the addition of a minimal number of deposition and etch steps. During a first masking step to open a contact, a subsequent etch opens up the P-channel gate area to thin down the underlying oxide. Polysilicon is then deposited which is followed by formation of an oxide. During a second masking step the oxide is etched and the polysilicon is etched thereby patterning the polysilicon and creating exposed polysilicon sidewalls. Dielectric isolation is then provided for the polysilicon sidewalls. In a first embodiment nitride spacers are then formed from a blanket layer of nitride which also results in nitride fillers about the polysilicon sidewalls. In a second embodiment the polysilicon sidewalls are oxidized thereby eliminating the steps for deposition and formation of nitride spacers. Next an etch stop layer of conductively doped polysilicon is deposited and covered with oxide. A third mask step allows a following etch to open local landing pads around future buried contact locations as well as define P-channel transistor gates.

25 Claims, 16 Drawing Sheets

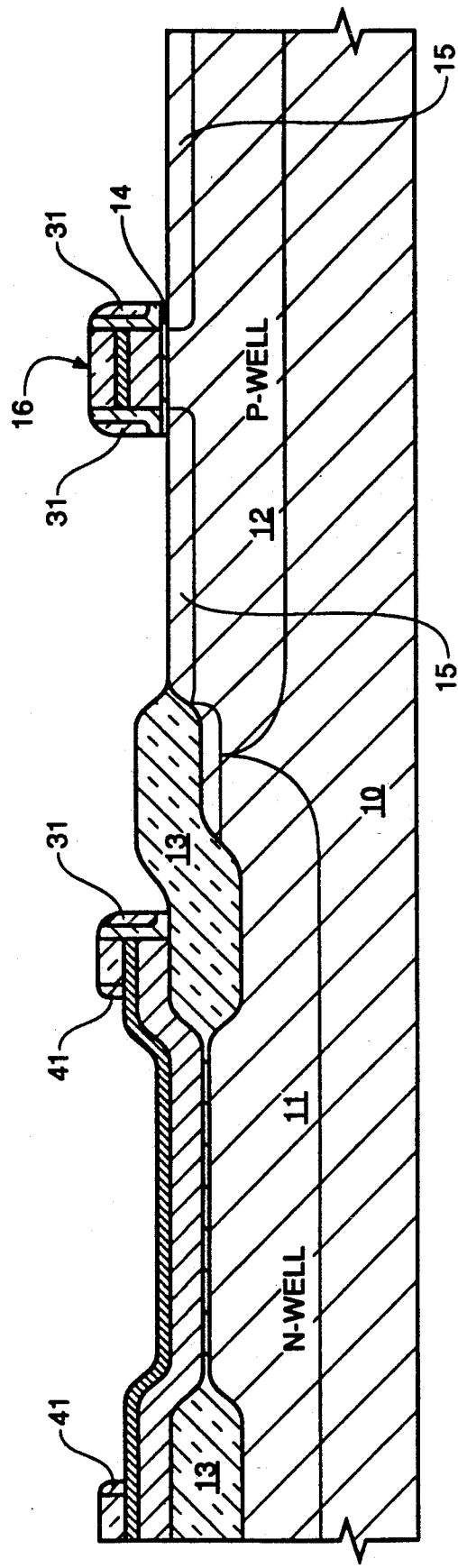

METHOD OF FORMING LOCAL ETCH STOP LANDING PADS FOR SIMULTANEOUS, SELF-ALIGNED DRY ETCHING OF CONTACT VIAS WITH VARIOUS DEPTHS

FIELD OF THE INVENTION

This invention relates generally to the field of semiconductor fabrication processing and in particular to a fabrication process to provide a method of self-aligned dry etching of contact vias with various depths.

BACKGROUND OF THE INVENTION

As circuit complexity increases and vertical integration becomes more and more complex, high topography of the device structures on a die of a semiconductor device gives rise to contact/via openings at various steps which have a large variation in the depth at different points on the die. Dry etching of these contacts with as large as 50 to 100% difference in the depth across the die causes severe problems due to under-etching and over-etching of the contacts. In addition, large amounts of silicon real estate is devoted to ensure margin for photo-alignment and etch. Conventional practices of using blanket etch stop layers limits the etch stop layers to insulator only which may not have the best etch selectivity required.

The present invention provides a method to circumvent the limitations of the conventional practices mentioned above by the use of "local" (or conductive) etch stop layers having highly selective etch characteristics vis-a-vis insulating layers into which the contact/vias are etched.

SUMMARY OF THE INVENTION

The present invention provides a method to use "local" etch stop layers that make it possible to use any kind of conducting material which possesses etch selectivity to an insulator, such as oxide (i.e. doped polysilicon, tungsten, tungsten silicide, titanium, titanium silicide, titanium nitride and the like) for etch stop landing pads. The process flow described herein uses conductively doped polysilicon as an example to accomplish this task without the need to add any extra photo or mask step to a conventional dynamic random access memory (DRAM) process flow and with the addition of a minimal number of deposition and etch steps.

During a first masking step to open a buried contact, an etch opens up the P-channel gate area to thin down the oxide. Polysilicon is deposited followed by formation of oxide. During a second masking step the oxide is etched and the polysilicon is etched thereby patterning the polysilicon and creating exposed polysilicon sidewalls. Dielectric isolation is then provided for the polysilicon sidewalls. In a first embodiment nitride spacers are then formed from a blanket layer of nitride which also results in nitride fillers about the polysilicon sidewalls. In a second embodiment the polysilicon sidewalls are oxidized thereby eliminating the steps for deposition and formation of nitride spacers. Next an etch stop layer of conductively doped polysilicon is deposited and covered with oxide. A third mask step allows a following etch to open local landing pads around future buried contact locations as well as define P-channel transistor gates.

BRIEF DESCRIPTION OF THE DRAWINGS

FIG. 1b depicts a composite cross-sectional view of processed wafer portion taken through a periphery location corresponding to the process steps taken in FIG. 1a;

FIGS. 4a and 4b depict cross-sectional views of the in-process wafer portion of FIGS. 3a and 3b respectively, following an anisotropic nitride etch to form vertical nitride spacers and nitride fillers;

DETAILED DESCRIPTION OF THE PREFERRED EMBODIMENTS

The present invention is described with reference to the process steps added to a dynamic random access memory fabrication process as depicted in FIG. 1a–7b which will become understandable to one skilled in the art from the detailed description that follows.

Figure 1A:
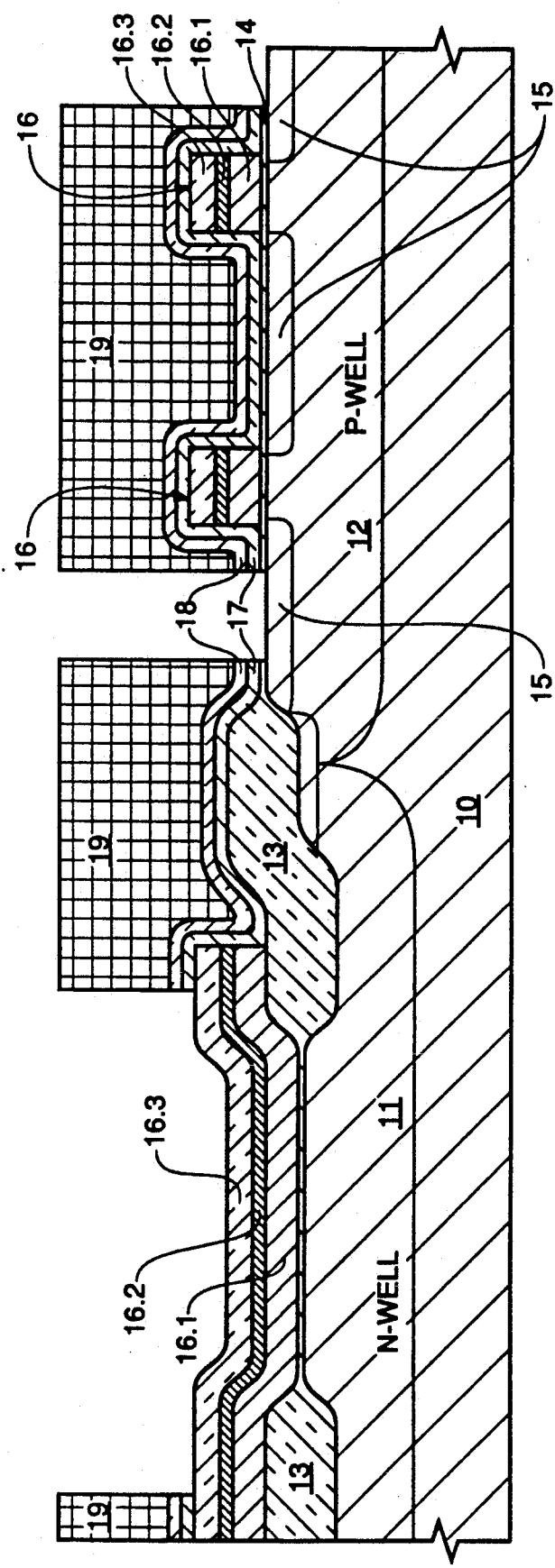
FIG. 1a depicts a composite cross-sectional view of processed wafer portion taken through a storage node location of a memory array, showing the beginning steps for forming first buried contacts using local etch stop pads of the present invention wherein first masking and first etching steps are performed.
Figure 1B:
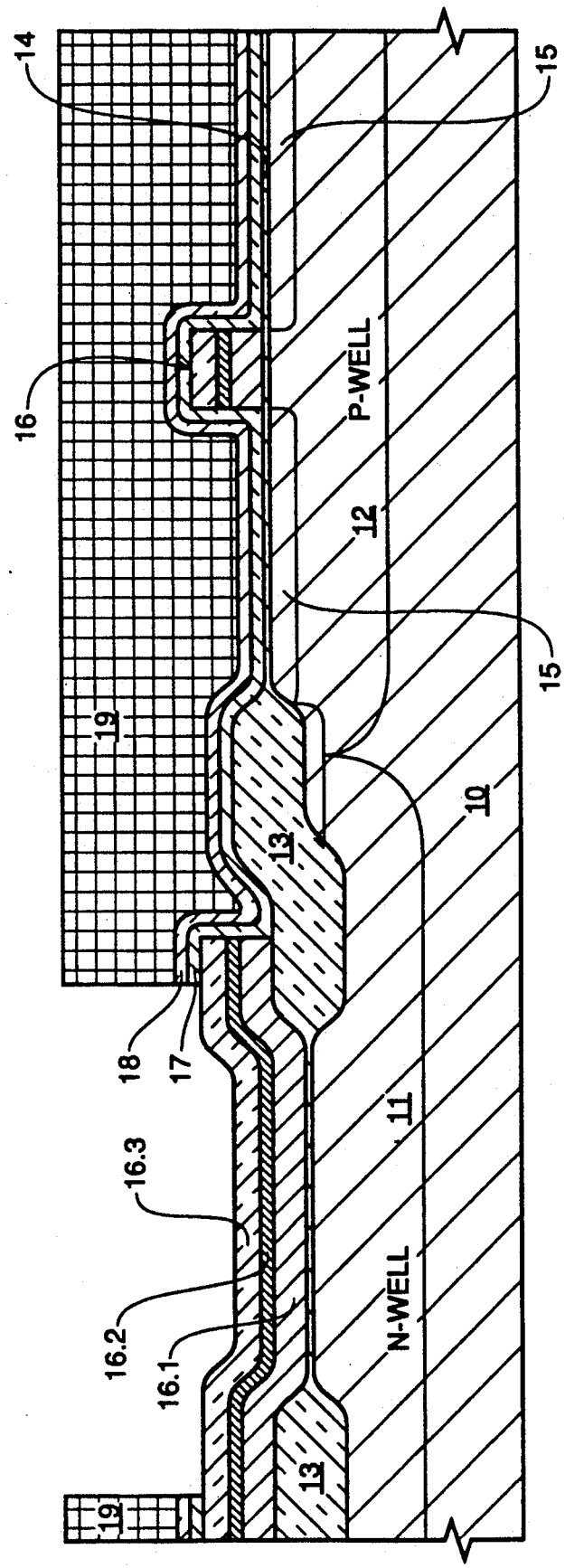

Referring now FIGS. 1a and 1b, cross-sectional views are presented of an in-process wafer that has been fabricated up to the point of having n-well 11 and p-well 12 residing in a p-type substrate 10. Field oxide 13 and gate oxide 14 isolate n-well 11 and p-well 12. Active areas 15 have been implanted into p-well 12 and are spanned by gate 16 to form active N-channel transistors in both the memory array (FIG. 1a) and in the periphery (FIG. 1b). Gate 16 is made from patterned layers of poly1 16.1, silicide 16.2 and oxide 16.3. First photoresist masking 19 has been placed and patterned over insulators (oxides) 17 and 18. It is preferred to have the combined height of oxides 17 and 18 approximately equal to the height of oxides 16.3. In this example, oxide 17 and 18 are approximately 3KÅ thick. A subsequent etch removes the unmasked portions of insulators 17 and 18 thereby exposing active area 15 as well as thinning the oxide stack (oxides 17, 18 and 16.3) which overlies a future P-channel transistor location, down to approximately 3kÅ thick.

Figure 2A:
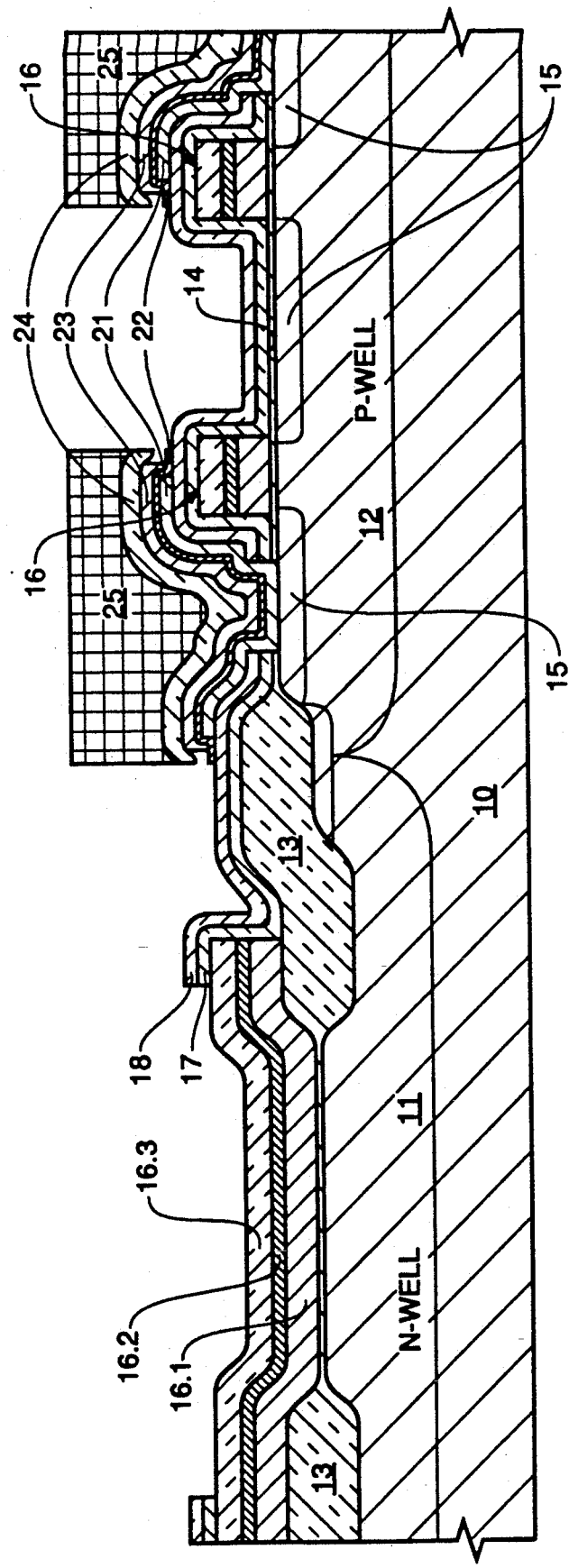
FIGS. 2a and 2b depict cross-sectional views of the in-process wafer portion of FIG. 1a and 1b respectively, following a first polysilicon deposition and patterning, a cell dielectric deposition, a second polysilicon deposition, a first oxide deposition, a second masking step and a second etching step.
Figure 2B:
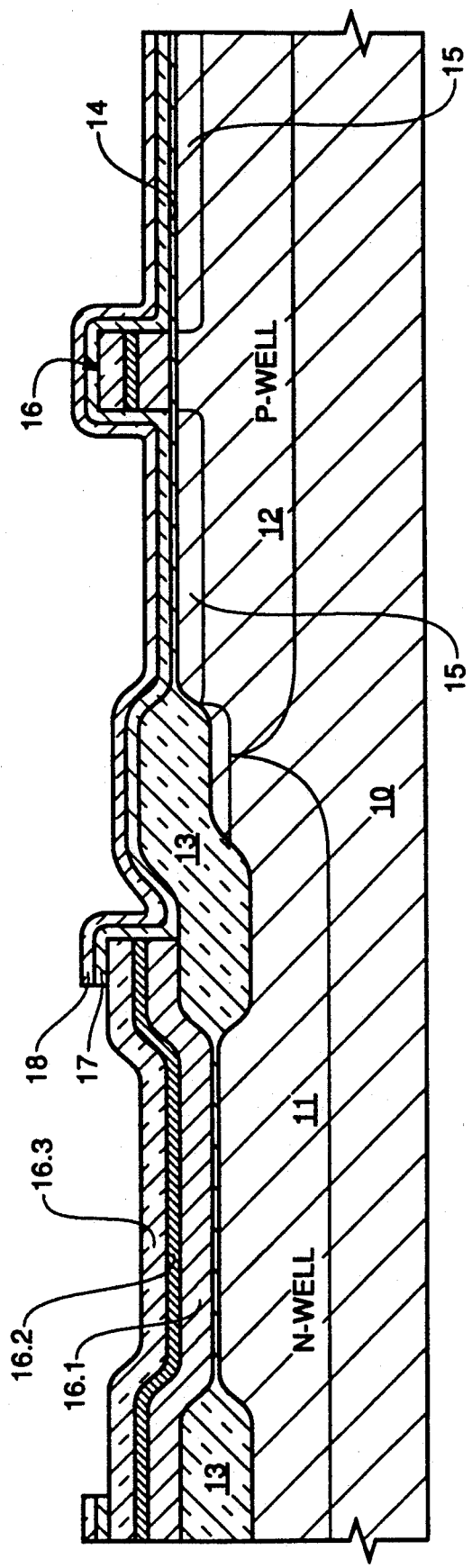

Referring now to FIGS. 2a and 2b, a poly2 layer 21 is deposited and patterned to form a poly storage node which is followed by a deposition of cell dielectric nitride layer 22. A poly3 layer 23 is then deposited which is followed by the deposition of oxide layer 24. A second photoresist masking layer 25 is patterned (only in the array portion shown in FIG. 2a) to allow for subsequent etches that remove unmasked oxide 24 and etches the edges of poly3 thereby undercutting into patterned poly3 layer 23.

Figure 3A:
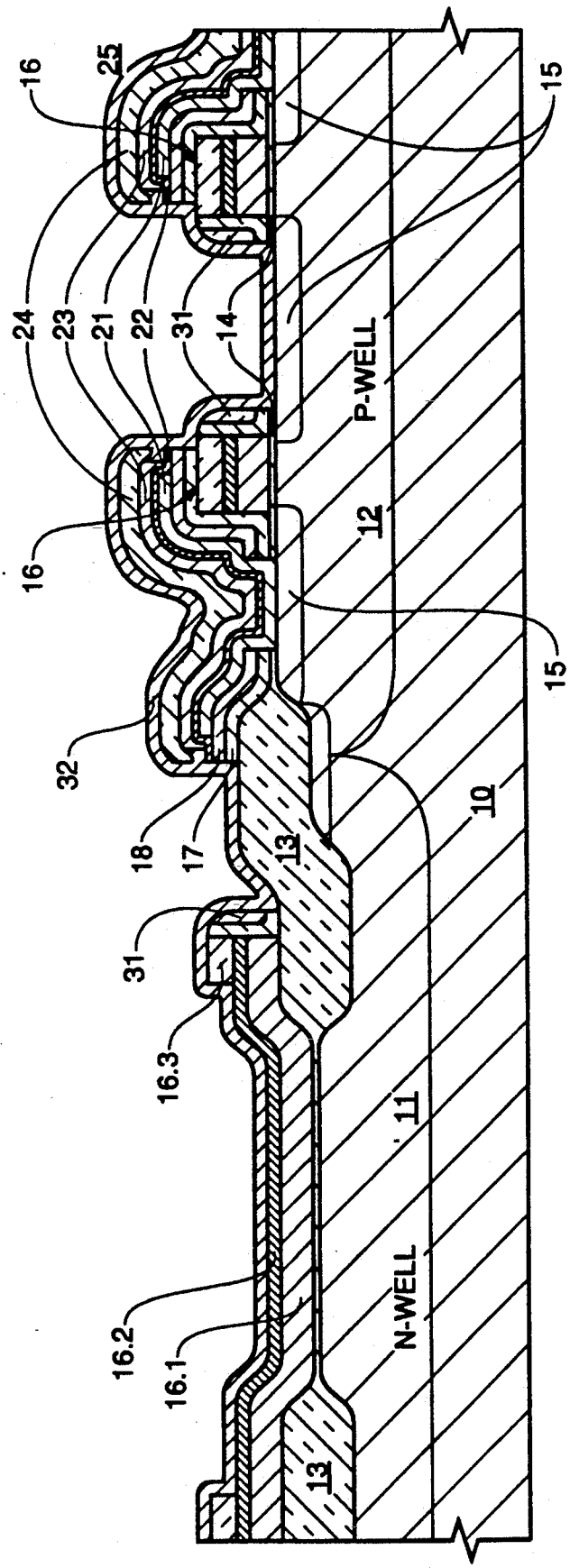
FIGS. 3a and 3b depict cross-sectional views of the in-process wafer portion of FIGS. 2a and 2b respectively, following an oxide spacer etch and deposition of a nitride layer.
Figure 3B:
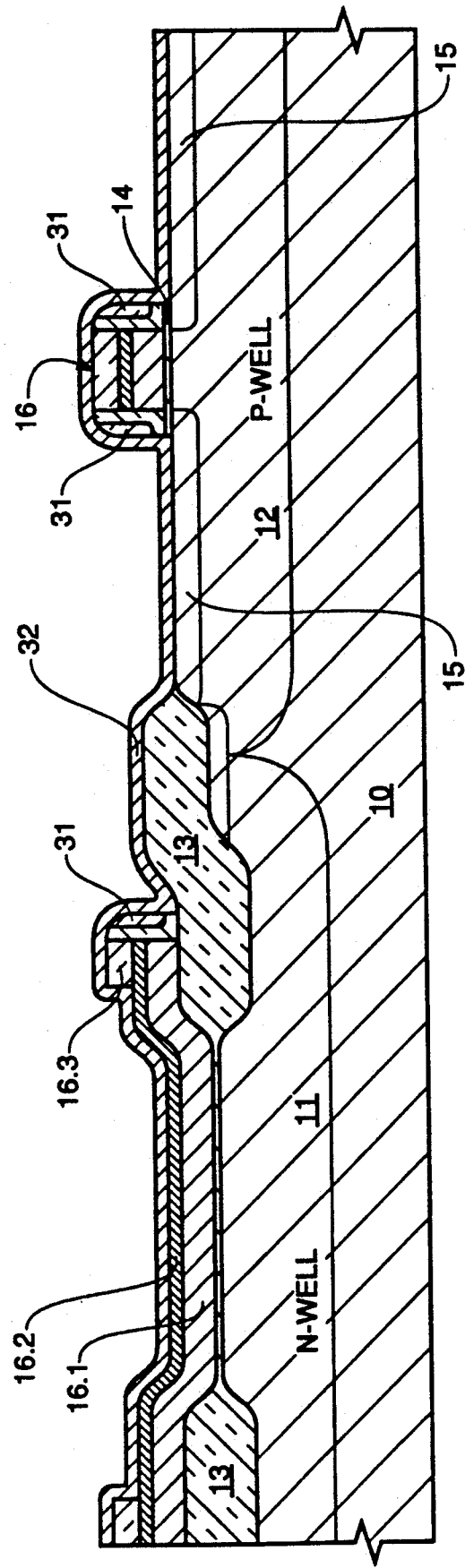

Referring now to FIGS. 3a and 3b, a oxide spacer etch is performed on oxides 17 and 18 to form oxide spacer 31. This etch also removes the exposed portion of oxide 16.3 as the etch stops on silicide 16.2. Photoresist 25 (of FIG. 2a) is stripped and a blanketing layer of nitride 32 is deposited.

Figure 3C:
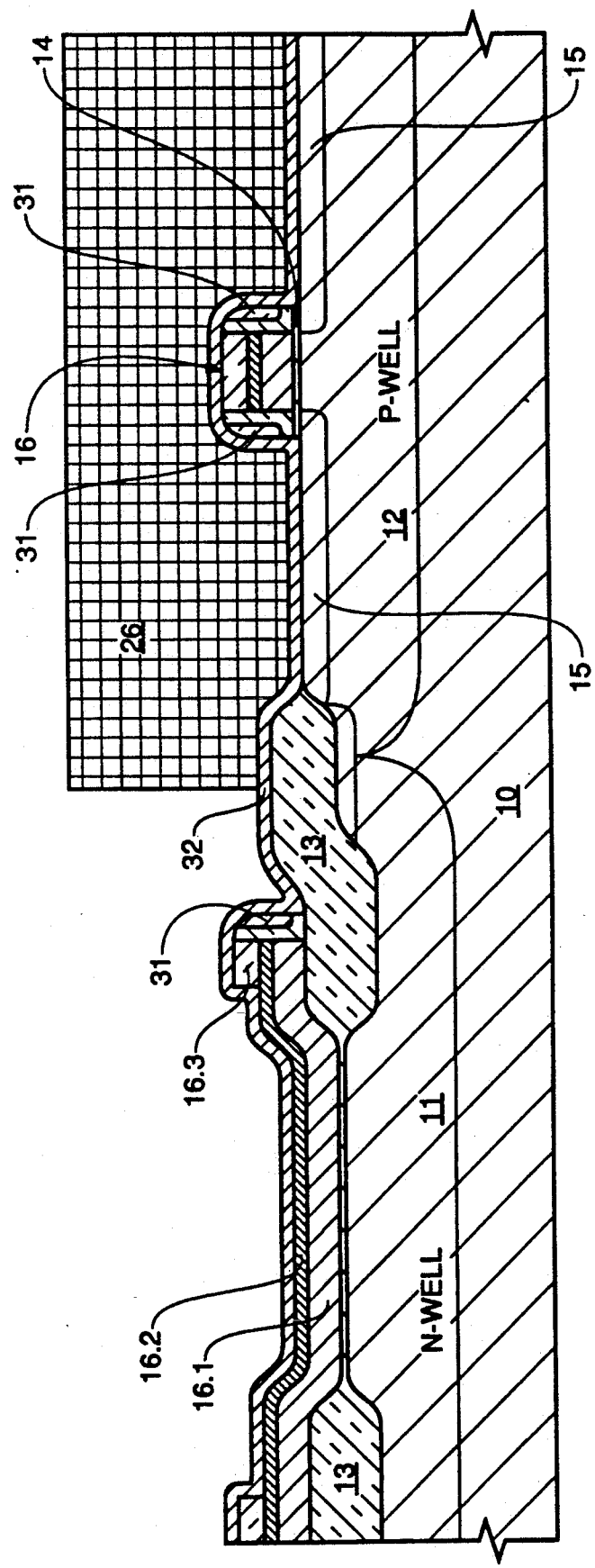
FIG. 3c depicts a cross-sectional view of the in-process wafer portion of FIG. 3b, following a third masking step.

Alternately, as shown in FIG. 3c, an extra photoresist masking layer 26 is placed and patterned over periphery N-channel devices if conductive etch stop landing pads (yet to be constructed) are not desired in the periphery.

Figure 4A:
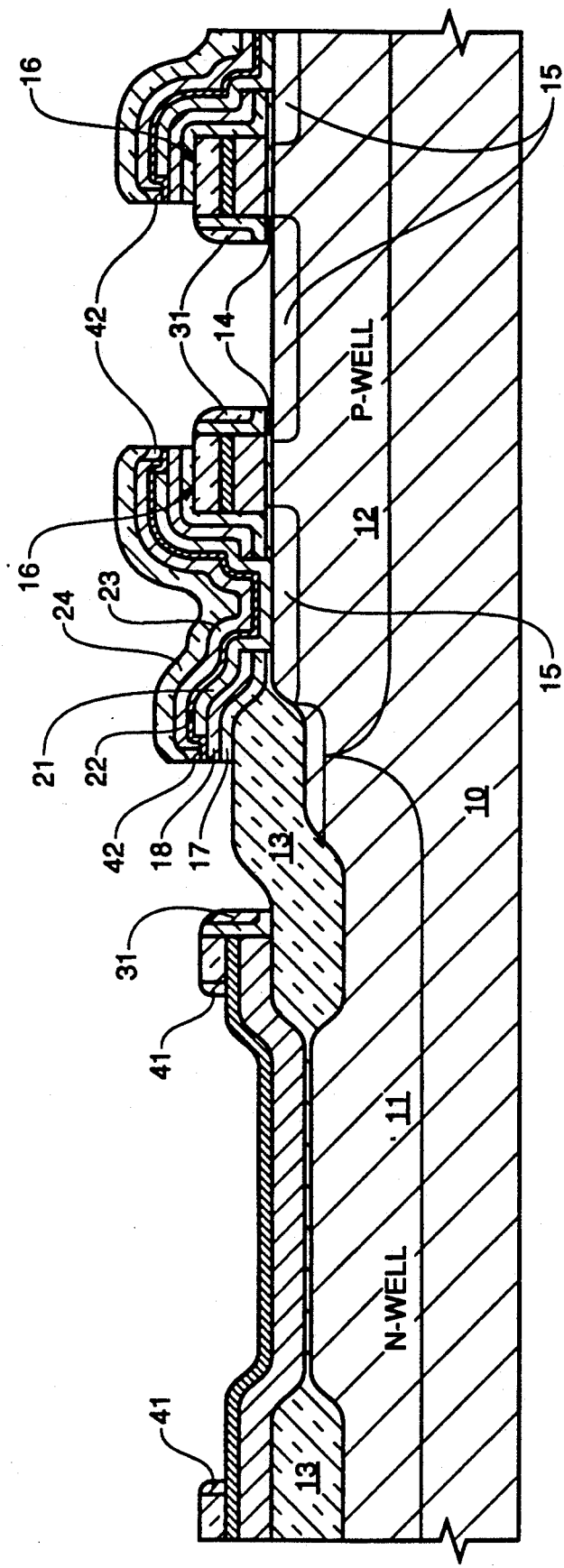

Referring now to FIG. 4a and 4b, an anisotropic nitride etch is performed on nitride 32 to form nitride spacers 41. In so doing, nitride remains in the undercuts of patterned poly3 layer 23 to form nitride fillers 42 and removed elsewhere.

Alternately, if so desired the etch could stop on cell dielectric nitride layer 23 and the patterned edges of poly3 could then be oxidized in order to insulate the poly3 layer. This would eliminate the subsequent nitride layer 32 deposition step as well as the etch step to form nitride spacers 41 and nitride fillers 42. Also, the undercutting of poly3 layer 23 would be avoided.

Figure 5A:
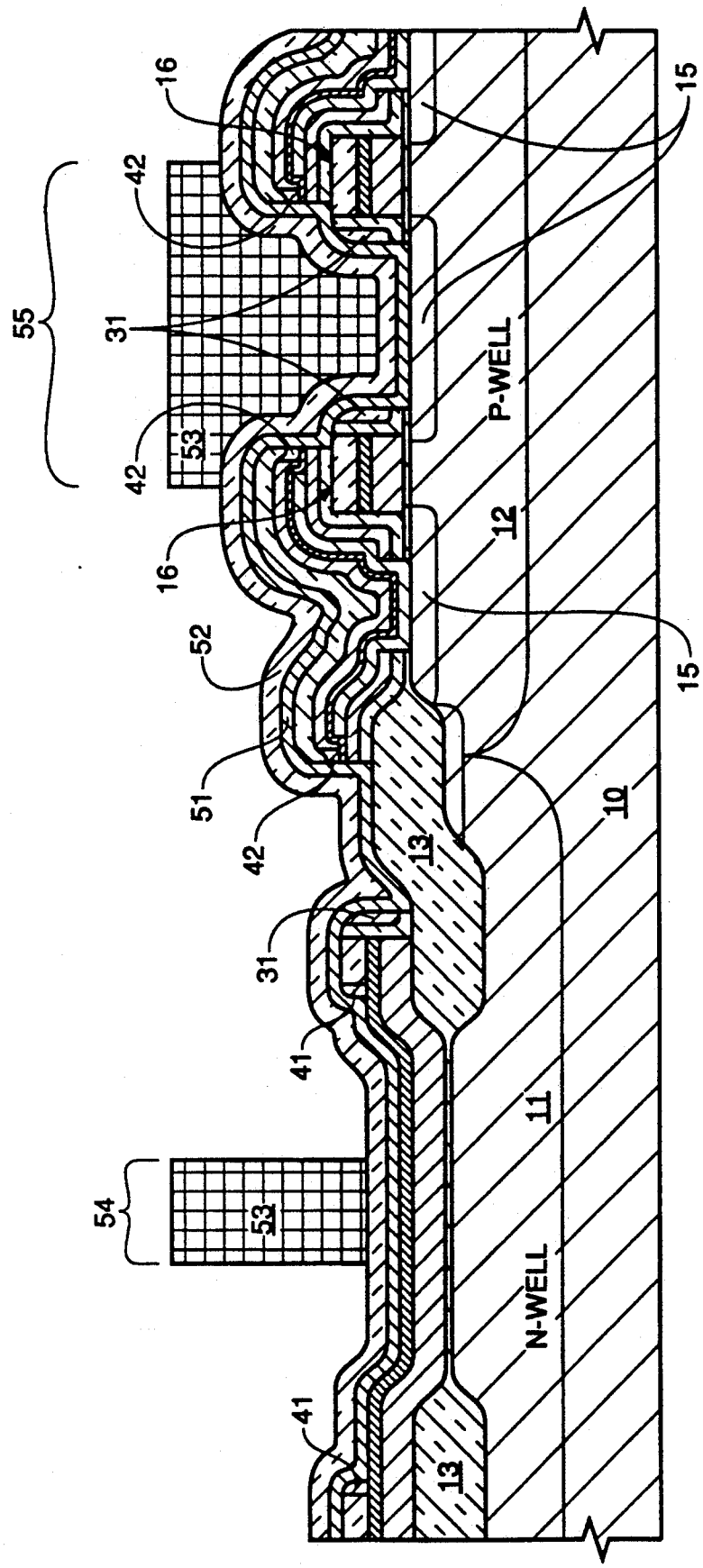
FIGS. 5a and 5b depict cross-sectional views of the in-process wafer portion of FIGS. 4a and 4b respectively, following a third deposition of conductively doped polysilicon, a second deposition of oxide and a third masking step.
Figure 5B:
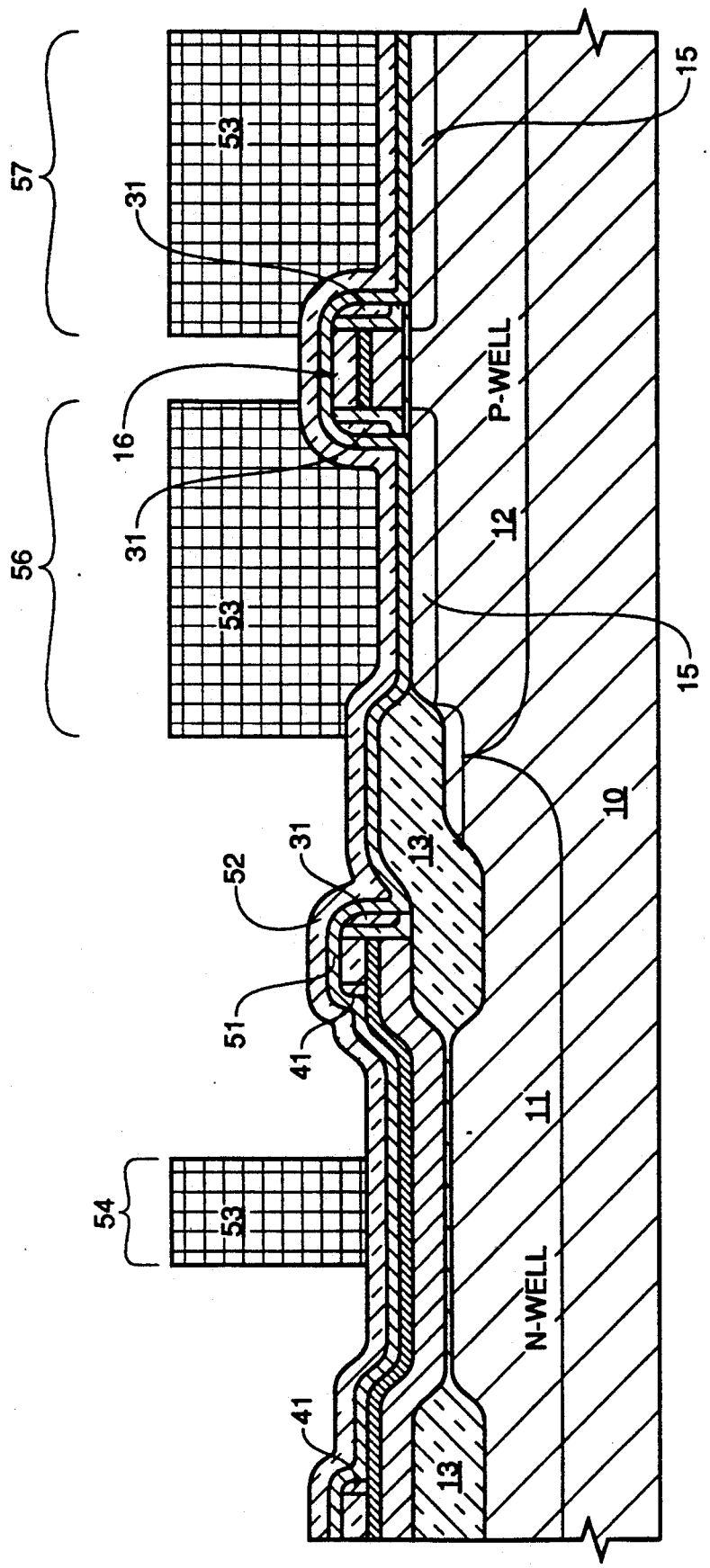

Referring now to FIGS. 5a and 5b, a conductively doped blanketing poly4 layer 51 is deposited which is followed by the deposition of blanketing oxide layer 52. Now a third masking layer 53 is placed and patterned to define P-channel transistors at locations 54 in both the array and the periphery as well as to define future interconnects between N-channel transistors at array locations 55 (FIG. 5a), and periphery locations 56 and 57 (FIG. 5b).

Figure 6A:
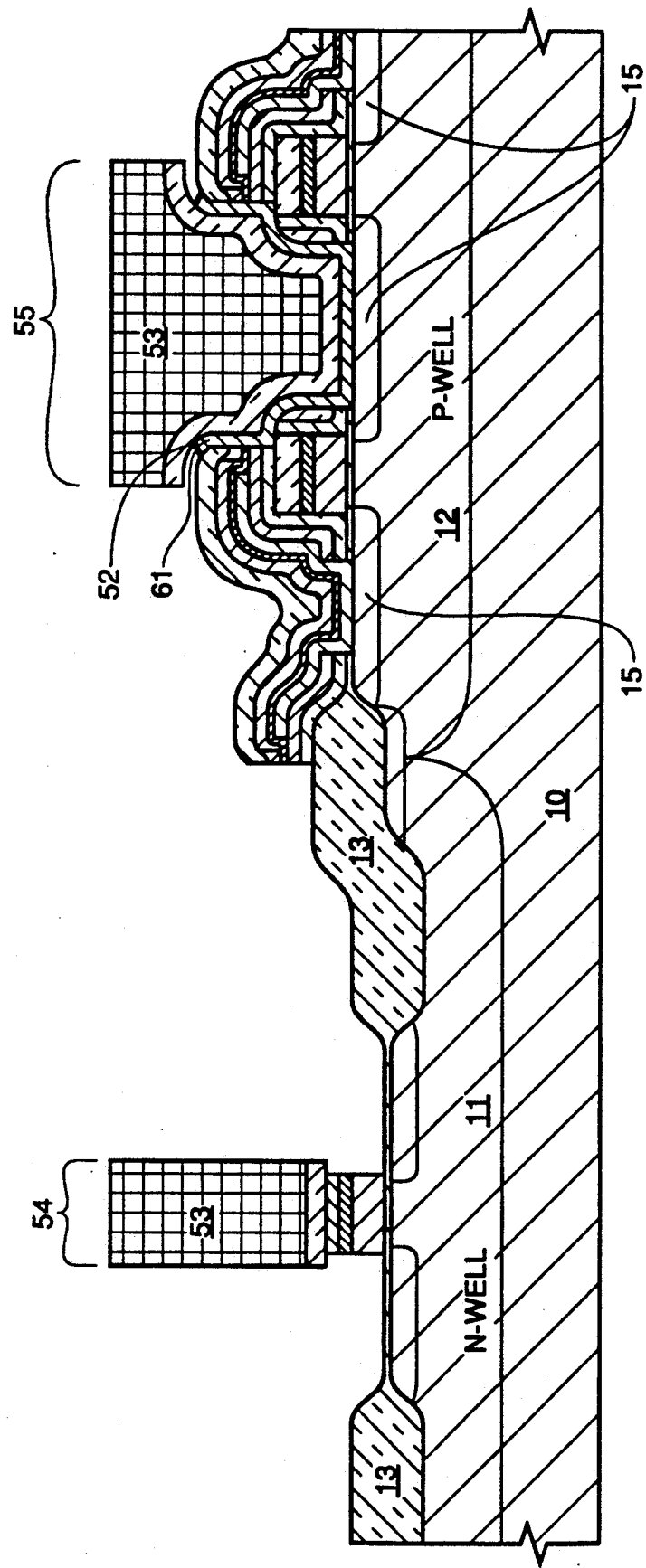
FIGS. 6a and 6b depict cross-sectional views of the in-process wafer portion of FIGS. 5a and 5b respectively, following a second oxide etch step and an etch step to remove unmasked portions of the third polysilicon layer.
Figure 6B:
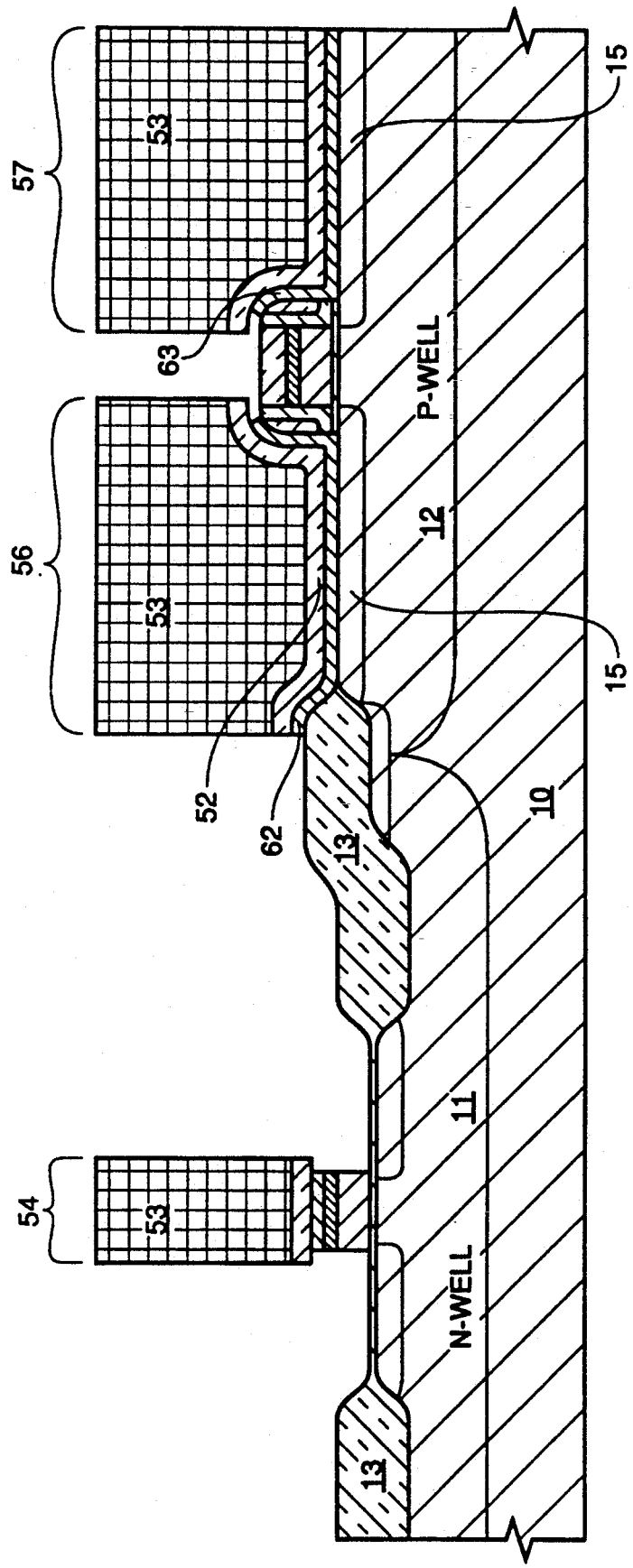

Referring now to FIGS. 6a and 6b, unmasked portions of oxide 52 are removed by an oxide etch that exposes poly4 layer 51. A subsequent etch is performed to remove unmasked portions of poly4 layer 51, silicide 16.2 and poly2 layer 16.1 with the etch stopping once oxide is reached (oxides 16.3, 14 and 13 in this case). The patterned portions of poly4 layer 51 now provide etch stop landing pads 61 in the array (as in FIG. 6a) and etch stop landing pads 62 and 63 in the periphery (FIG. 6b) for future contact locations.

Figure 6C:
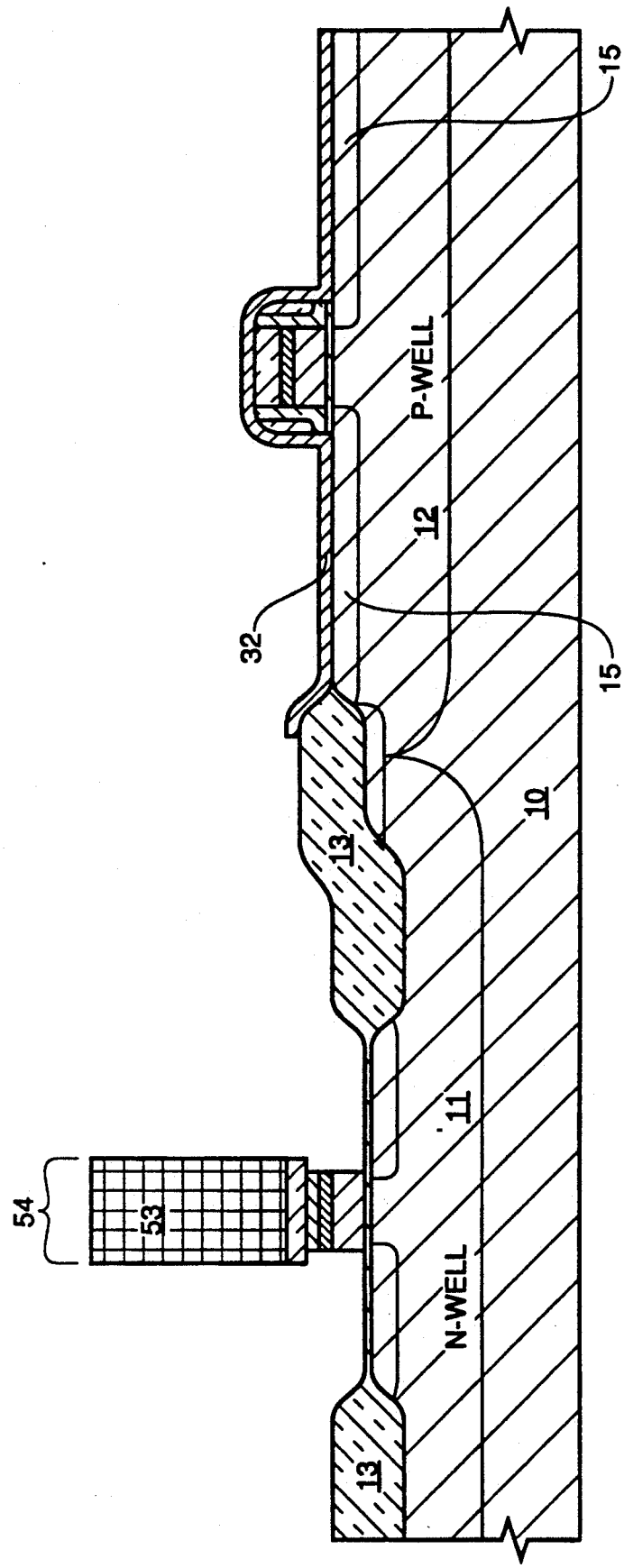
FIG. 6c depicts a cross-sectional view of alternate processing results in contrast to FIG. 6b, wherein no conductive etch stop pads are fabricated in the periphery.

Alternately, as shown in FIG. 6c, if an extra mask was used to protect N-channel devices in the periphery (FIG. 3c), then no mask would be required as the subsequent etch would now stop on nitride 32.

Figure 7A:
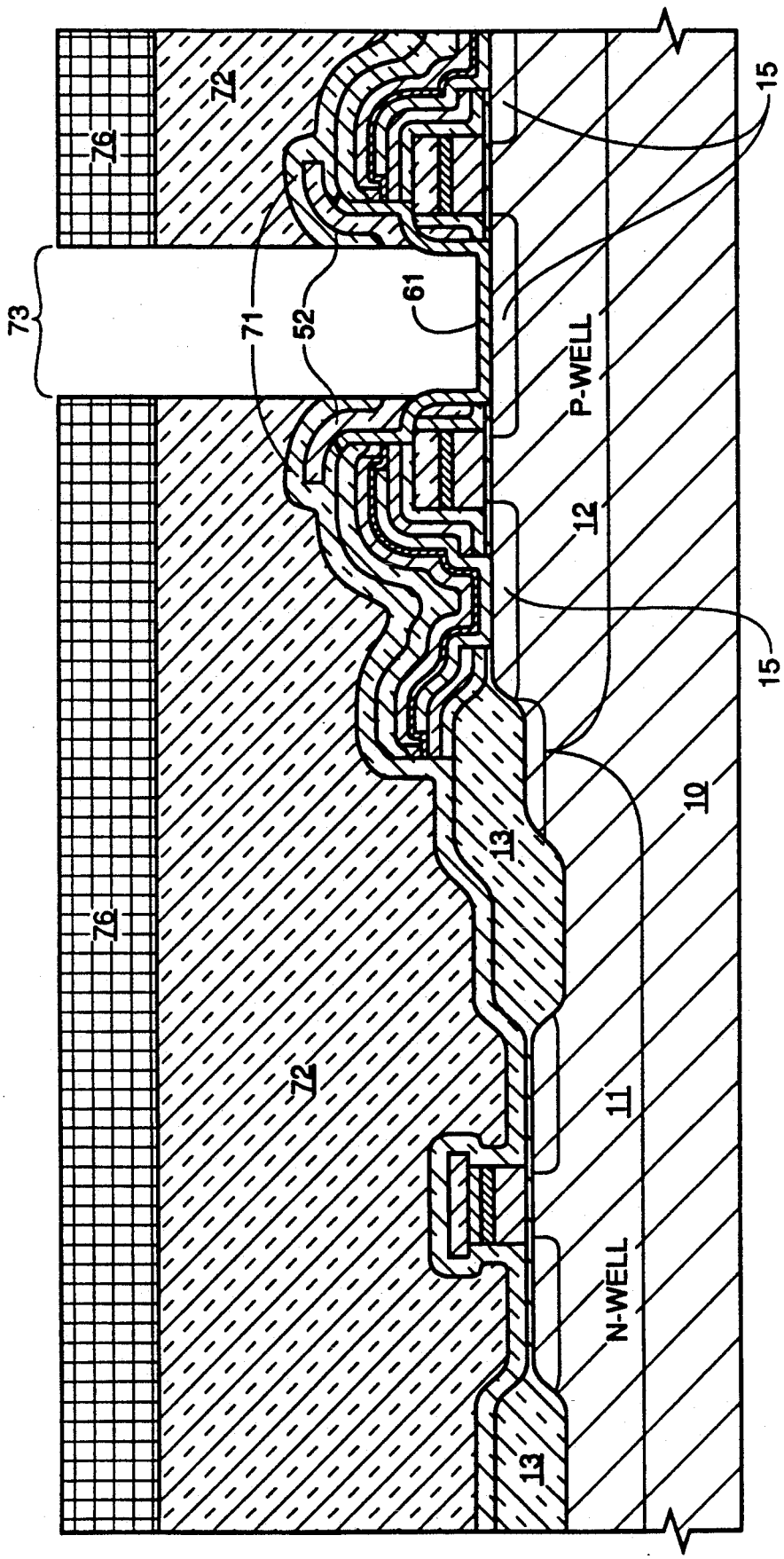
FIGS. 7a and 7b depict cross-sectional views of the in-process wafer portion of FIG. 6a and 6b respectively, following depositions of TEOS and glass and opening of second buried contact locations.
Figure 7B:
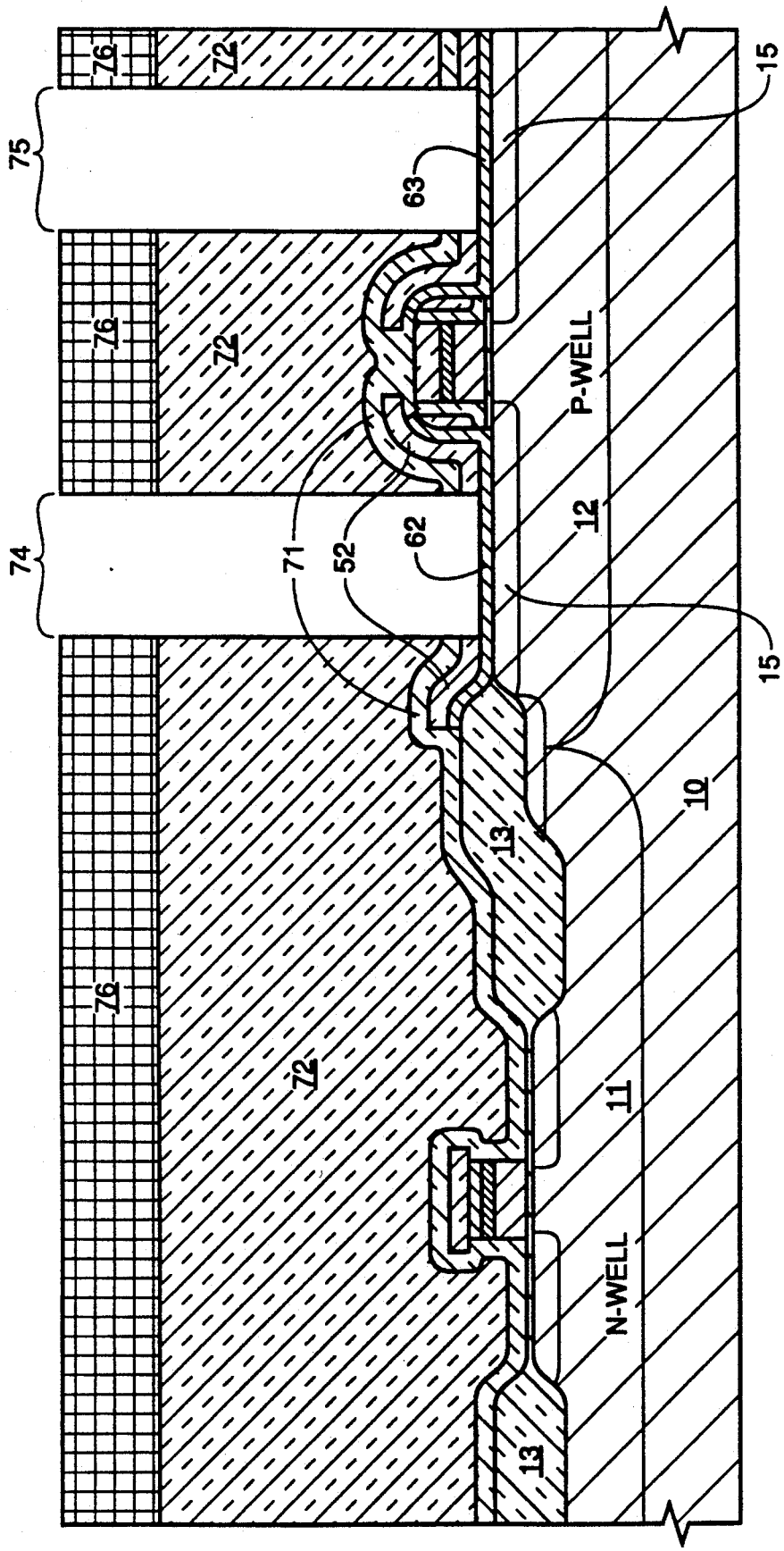

Referring now to FIGS. 7a and 7b, a layer of TEOS 71 is deposited which is followed by placing and planarizing glass layer 72 (usually BPSG). A fourth masking layer 76 is placed and patterned to define buried contacts in the array at location 73 (FIG. 7a) and contacts in the periphery at locations 74 and 75 (FIG. 7b). A subsequent etch is performed to open locations 73, 74 and 75 with the etch stopping on poly4 etch stop pads 61, 62 and 63. Now the die is ready for removal of masking layer 76 and for the placing of a conductive material (usually metal) to make contact to the now exposed poly4 etch stop landing pads 61, 62 and 63 at contact locations 73, 74 and 75. The die is then completed using conventional process steps.

The etch stop poly4 pads allow for a reduction in the overall die real estate required for any contacts that need to be made at different die levels, (even down to the silicon substrate) in that mask alignment is no longer critical as the etch stop landing pads are now self-aligned to the desired connecting point. For example, in a mini-stacked capacitor DRAM process, at the contact locations the underlying active area must be as wide as the desired contact opening and must also allow for misalignment tolerances. If a given lithography process allows 0.6μ wide contacts and can tolerate misalignment of 0.15μ to either side of the contact, then the overall active area must have a width of approximately 0.9μ. By using 0.9μ wide etch stop landing pads the underlying active area can now be shrunk to around 0.35μ which results in approximately 60% savings of die real estate for the active area. This could translate into a overall die real estate savings of 20% for integrated circuits containing large memory arrays.

The present invention discussed above was described in terms of a split poly process, in that the N-channel and P-channel devices are formed at different mask levels rather than the conventional method of forming the N and P-channel devices at the same mask level. Furthermore, this process provides for a method to construct conductive etch stop pads (any conductive material used in semiconductor processes will work, but polysilicon is used as an example) while keeping the number of mask steps required to build the pads to three or four.

It is to be understood that although the present invention has been described in a preferred embodiment, various modifications known to those skilled in the art, such as using this method to form multi-level contacts in processes such as those for fabricating other real estate extensive semiconductors (microprocessors), may be made without departing from the invention as recited in the several claims appended hereto.

We claim:

1. A process for creating local conductive etch stop landing pads in a semiconductor device constructed on a silicon substrate having first and second type active areas defined therein, said process comprising the steps of:

a) opening first buried contact locations via a first masking layer thereby providing access to said first type active areas while simultaneously defining locations of active devices overlying said second type active areas, wherein said second type active areas are covered with a first insulative layer of a first type dielectric material, a first conductive layer and a second insulative layer of said first type dielectric material;

b) removing said first masking layer;

c) forming first buried contacts by placing and patterning a second conductive layer of material overlying said first buried contact locations;

d) forming a third layer of insulative material of second type dielectric superjacent existing semiconductor surface;

e) forming a third conductive layer of material superjacent said third insulative layer;

f) forming a fourth insulative layer of material, of said first type dielectric material, superjacent said third conductive layer;

g) forming and patterning a second masking layer superjacent said fourth insulative layer, said second masking layer thereby overlying entire said patterned second conductive layer;

h) removing unmasked portions of said fourth insulative layer, said third conductive layer and said third insulative layers whereby each masked edge of said third conductive layer is removed thereby forming undercuts in the masked edges of said third conductive layer;

i) removing said second masking layer;

j) forming a fifth insulative layer of said second type dielectric material superjacent existing semiconductor device surface;

k) anisotropically removing said fifth insulative layer whereby insulative spacers are formed on vertical topography and fillers are formed to fill said undercuts;

l) forming a fourth conductive layer of material superjacent said existing semiconductor surface;

m) forming a sixth insulative layer of said first type dielectric material superjacent said fourth conductive layer;

n) forming and patterning a third masking layer to define said active devices overlying said second type active areas while simultaneously defining second buried contact locations overlying said first type active areas;

o) removing unmasked portions of said sixth insulative layer;

p) removing remaining unmasked material down to an insulative layer of said first type dielectric material thereby defining said conductive etch stop landing pads; and q) removing said third masking layer.

2. The process of claim 1 wherein said process is a split poly process.

3. The process of claim 1 wherein said first and second active areas are n-type and p-type active areas, respectively.

4. The process of claim 1 wherein said first type dielectric material comprises oxide and said second type dielectric material comprises nitride.

5. The process of claim 1 wherein said first, second, third and fourth conductive material layers comprise conductively doped polysilicon.

6. The process of claim 1 wherein said fourth conductive material layer comprises a material selected from the group consisting essentially of doped polysilicon, tungsten, tungsten silicide, titanium, titanium silicide, and titanium nitride.

7. The process of claim 1 wherein an additional step comprising a masking layer that is placed and patterned overlying said access devices defined in said first type active areas located in said periphery is added between steps "j" and "k".

8. The process of claim 1 wherein said steps "h" through "k" are substituted with the steps comprising:

h) removing unmasked portions of said fourth insulative layer and said third conductive layer;

i) oxidizing said patterned edges of said third conductive layer;

j) removing exposed portions of said third insulative layer; and k) removing said second masking layer.

9. The process of claim 8 wherein said process is a split poly process.

10. The process of claim 8 wherein said first and second active areas are n-type and p-type active areas, respectively.

11. The process of claim 8 wherein said first type dielectric material comprises oxide and said second type dielectric material comprises nitride.

12. The process of claim 8 wherein said first, second, third and fourth conductive material layers comprise conductively doped polysilicon.

13. The process of claim 8 wherein said fourth conductive material layer comprises a material selected from the group consisting essentially of doped polysilicon, tungsten, tungsten silicide, titanium, titanium silicide, and titanium nitride.

14. A split poly process for creating local conductive etch stop landing pads, in a dynamic random access memory device constructed on a silicon substrate having a memory array and a periphery with first and second type active areas defined therein, said process comprising the steps of:

a) opening first buried contact locations via a first masking layer thereby providing access to said first type active areas in said memory array while simultaneously defining locations of active transistors overlying said second type active areas, wherein said second type active areas are covered with a first insulative layer of a first type dielectric material, a first conductive layer and a second insulative layer of said first type dielectric material;

b) removing said first masking layer;

c) forming first buried contacts by placing and patterning a second conductive layer of material overlying said first buried contact locations;

d) forming a third layer of insulative material of second type dielectric superjacent existing memory device surface;

e) forming a third conductive layer of material superjacent said third insulative layer;

f) forming a fourth insulative layer of material, of said first type dielectric material, superjacent said third conductive layer;

g) forming and patterning a second masking layer superjacent said fourth insulative layer, said second masking layer thereby overlying entire said patterned second conductive layer;

h) removing unmasked portions of said fourth insulative layer, said third conductive layer and said third insulative layers whereby each masked edge of said third conductive layer is removed thereby forming undercuts in the masked edges of said third conductive layer;

i) removing said second masking layer;

j) forming a fifth insulative layer of said second type dielectric material superjacent existing memory device surface;

k) anisotropically removing said fifth insulative layer whereby insulative spacers are formed on vertical topography and fillers are formed to fill said undercuts;

l) forming a fourth conductive layer of material superjacent said existing memory device surface;

m) forming a sixth insulative layer of said first type dielectric material superjacent said fourth conductive layer;

n) forming and patterning a third masking layer to define said active transistors overlying said second type active areas while simultaneously defining second buried contact locations overlying said first type active areas;

o) removing unmasked portions of said sixth insulative layer;

p) removing remaining unmasked material down to an insulative layers of said first type dielectric material thereby defining said conductive etch stop landing pads; and q) removing said third masking layer.

15. The process of claim 14 wherein said first and second active areas are n-type and p-type active areas, respectively.

16. The process of claim 14 wherein said first type dielectric material comprises oxide.

17. The process of claim 14 wherein said second type dielectric material comprises nitride.

18. The process of claim 14 wherein said first, second, third and fourth conductive material layers comprise conductively doped polysilicon.

19. The process of claim 14 wherein said fourth conductive material layer comprises a material selected from the group consisting essentially of doped polysilicon, tungsten, tungsten silicide, titanium, titanium silicide, and titanium nitride.

20. The process of claim 14 wherein an additional step comprising a masking layer that is placed and patterned overlying said access transistors defined in said first type active areas located in said periphery is added between steps "j" and "k".

21. The process of claim 14 wherein said steps "h" through "k" are substituted with the steps comprising:

h) removing unmasked portions of said fourth insulative layer and said third conductive layer;

i) oxidizing said patterned edges of said third conductive layer;

j) removing exposed portions of said third insulative layer; and k) removing said second masking layer.

22. The process of claim 21 wherein said first and second active areas are n-type and p-type active areas, respectively.

23. The process of claim 21 wherein said first type dielectric material comprises oxide and said second type dielectric material comprises nitride.

24. The process of claim 21 wherein said first, second, third and fourth conductive material layers comprise conductively doped polysilicon.

25. The process of claim 21 wherein said fourth conductive material layer comprises a material selected from the group consisting essentially of doped polysilicon, tungsten, tungsten silicide, titanium, titanium silicide, and titanium nitride.

* * * * *